US011569088B2

(12) United States Patent
Wang et al.

(10) Patent No.: US 11,569,088 B2
(45) Date of Patent: Jan. 31, 2023

(54) AREA-SELECTIVE ATOMIC LAYER DEPOSITION OF PASSIVATION LAYERS

(71) Applicants: Applied Materials, Inc., Santa Clara, CA (US); National University of Singapore, Singapore (SG)

(72) Inventors: Yong Wang, Singapore (SG); Andrea Leoncini, Singapore (SG); Doreen Wei Ying Yong, Singapore (SG); John Sudijono, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 210 days.

(21) Appl. No.: 17/081,498

(22) Filed: Oct. 27, 2020

(65) Prior Publication Data

US 2022/0130659 A1     Apr. 28, 2022

(51) Int. Cl.
*H01L 21/31*     (2006.01)
*H01L 21/02*     (2006.01)

(52) U.S. Cl.
CPC .... *H01L 21/0228* (2013.01); *H01L 21/02118* (2013.01)

(58) Field of Classification Search
CPC ........................ H01L 21/0228; H01L 21/02118
See application file for complete search history.

(56) References Cited

U.S. PATENT DOCUMENTS

| 7,994,640 B1* | 8/2011 | Alers ................... H01L 21/288 257/508 |
| 2008/0186653 A1 | 8/2008 | Lee et al. |
| 2019/0316256 A1 | 10/2019 | Bhuyan et al. |

FOREIGN PATENT DOCUMENTS

| WO | 2019018379 A1 | 1/2019 |
| WO | 2019036188 A1 | 2/2019 |
| WO | 2019066814 A1 | 4/2019 |
| WO | 2020143624 A1 | 7/2020 |

OTHER PUBLICATIONS

PCT International Search Report and Written Opinion in PCT/US2021/056626 dated Feb. 18, 2022, 11 pages.
Del Barrio, J., et al., "Light to shape the future: from photolithography to 4d printing", Advanced optical materials, 2019, vol. 7, No. 16, Article No. 1900598, pp. 1-33.
U.S. Appl. No. 17/081,494, filed Oct. 27, 2020. "Selective Deposition Of A Heterocyclic Passivation Film On A Metal Surface".
U.S. Appl. No. 17/081,506, filed Oct. 27, 2020. "Selective Deposition Of A Passivation Film".
U.S. Appl. No. 17/081,482, filed Oct. 27, 2020. "Selective Deposition Of A Passivation Film On A Metal Surface".
Adamkiewicz, Maigorzata, "Self-Assembled Monolayers On Silicon: Deposition and Surface Chemistry", http://hdl handle.net/10023/3938.
Bobb-Semple, Dara, et al., "Area-Selective Atomic Layer Deposition Assisted by Self-Assembled Monolayers: A Comparison of Cu, Co, W, and Ru", Chem. Mater. 2019, 31, 1635-1645, Feb. 5, 2019.
Durainatarajan, P., et al., "Self-assembly on copper surface by using imidazole derivative for corrosion protection", Journal of Adhesion Science and Technology, 2018, vol. 32, No. 16, 1733-1749, Feb. 19, 2018.

(Continued)

*Primary Examiner* — Victor A Mandala
*Assistant Examiner* — Colleen E Snow
(74) *Attorney, Agent, or Firm* — Servilla Whitney LLC

(57) ABSTRACT

Methods of enhancing selective deposition are described. In some embodiments, a passivation layer is deposited on a metal surface before deposition of a dielectric material. A block I molecule is deposited on a metal surface, and a block II molecule is reacted with the block I molecule to form a passivation layer.

21 Claims, 2 Drawing Sheets

(56) References Cited

OTHER PUBLICATIONS

Khuong, Kelli S., et al., "The Mechanism of the Self-Initiated Thermal Polymerization of Styrene. Theoretical Solution of a Classic Problem", J. Am Chem. Soc. 2005, 127, 1265-1277.
Liang, Liyuan, et al., "The copper(I)-catalyzed alkyne-azide cycloaddition (CuAAC) "click" reaction and its applications. An overview", Coordination Chemistry Reviews 255 (2011) 2933-2945.
Pattison, Thomas G., et al., "Surface Initiated Polymer Thin Films for the Area Selective Deposition and Etching of Metal Oxides", ACS Nano, https://dx.doi.org/10.1021/acsnano.9b09637, Mar. 13, 2020.
Rao, B V Appa, et al., "Self-assembled 1-octadecyl-1H-benzimidazole film on copper surface for corrosion protection", J. Chem. Sci. vol. 125, No. 6, Nov. 2013, pp. 1325-1338, Aug. 21, 2013.
Winther-Jensen, Bjorn, et al., "Vapor Phase Polymerization of Pyrrole and Thiophene Using Iron(III) Sulfonates as Oxidizing Agents", Macromolecules 2004, 37, 5930-5935, Jul. 10, 2004.
Ziarani, Ghodsi Mohammadi, et al., "Advances in click chemistry for silica-based material construction", RSC Adv.. 2016, 6, 21979.

* cited by examiner

AREA-SELECTIVE ATOMIC LAYER DEPOSITION OF PASSIVATION LAYERS

TECHNICAL FIELD

Embodiments of the disclosure relate to methods for selectively depositing a passivation layer. In particular, embodiments of the disclosure are directed to methods of depositing passivation layers selectively on metal surfaces or dielectric surfaces.

BACKGROUND

The semiconductor industry faces many challenges in the pursuit of device miniaturization which involves rapid scaling of nanoscale features. Such issues include the introduction of complex fabrication steps such as multiple lithography steps and integration of high performance materials. To maintain the cadence of device miniaturization, selective deposition has shown promise as it has the potential to remove costly lithographic steps by simplifying integration schemes.

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor.

Area-selective atomic layer deposition (AS-ALD) can be used for selective deposition of material. During AS-ALD, when the deposited ALD film becomes thicker than the self-assembled monolayers (SAM) used to passivate non-growth surfaces, the ALD film may grow sideways (which may be referred to as mushrooming), thus reducing selectivity. There is an ongoing need in the art for methods to improve deposition selectivity and to avoid problems during AS-ALD.

SUMMARY

One or more embodiments of the disclosure are directed to a method of depositing a film. A method of selectively depositing a film on a substrate surface including a metal surface and a dielectric surface comprises: depositing a block I molecule on the metal surface, the block I molecule comprising one or more of an alkyne and an alkene, and reacting the block I molecule with a block II molecule to form a passivation layer on the metal surface, the block II molecule comprising one or more of an azide and a thiol.

Another embodiment of the disclosure is directed to a method of forming a film. A method of selectively depositing a film on a substrate surface including a metal surface and a dielectric surface comprises: forming a passivation layer on the metal surface by reacting one or more of an alkyne and an alkene with one or more of a thiol and an azide, the alkyne and the alkene independently comprising a headgroup selected from the group consisting of a pyrrole group, an amine group, an acetylacetone group, an alkyl hydrazide group, a cyclic hydrazide group, a phosphonate group, a heterocyclic group, a phosphonic acid group, a phosphonic ester group, a pyrrolidine group, a pyrazole group, an imidazole group, a furan group, a biimidazole group, a thiophene group, a thiazole group, a thiadiazole group, a pyridine group, a pyridazine group, a pyrimidine group, a quinoxaline group, an indazole group, a thiazine group, a phosphinine group, a phosphinoline group, and a phosphole group, the headgroup attached to a hydrocarbon chain n lengths long, the azide and the thiol independently comprising a tail group selected from the group consisting of an alicyclic hydrocarbon chain, a branched hydrocarbon chain, a polyaryl hydrocarbon chain, and a polyester chain, the tail group attached to hydrocarbon chain m lengths long; and depositing a dielectric layer on the dielectric surface.

Other embodiments of the disclosure are directed to a non-transitory computer readable medium including instructions, that, when executed by a controller of a processing chamber, cause the processing chamber to perform operations of: deposit a block I molecule on a metal surface, the block I molecule comprising one or more of an alkyne and an alkene; and react the block I molecule with a block II molecule to form a passivation layer on the metal surface, the block II molecule comprising one or more of an azide and a thiol.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
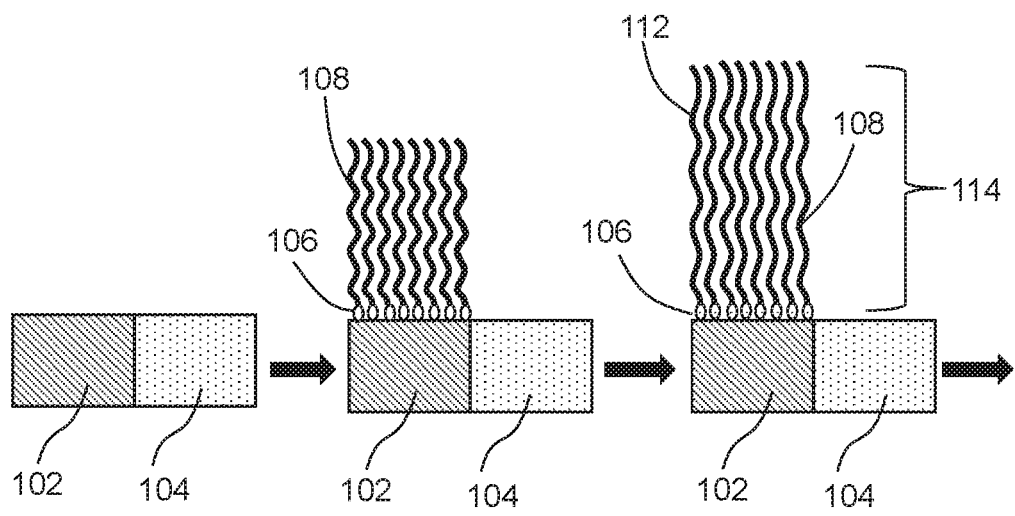
FIG. 1 illustrates a reaction schematic of selectively depositing a film on a substrate according to one or more embodiments.
Figure 1:
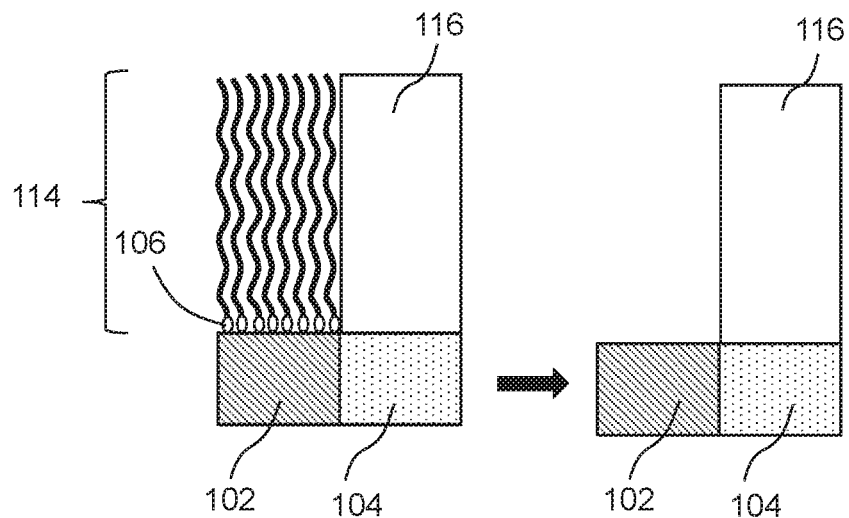

Before describing several exemplary embodiments of the invention, it is to be understood that the invention is not limited to the details of construction or process steps set forth in the following description. The invention is capable of other embodiments and of being practiced or being carried out in various ways.

A "substrate" or "substrate surface", as used herein, refers to any portion of a substrate or portion of a material surface formed on a substrate upon which film processing is performed. For example, a substrate surface on which processing can be performed includes materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate. Substrates may have various dimensions, such as 200 mm or 300 mm diameter wafers, as well as, rectangular or square panes. In some embodiments, the substrate comprises a rigid discrete material.

Area-selective atomic layer deposition (AS-ALD) using self-assembled monolayers (SAMs) as deposition blocking layers is a useful technique to apply advantages in nanoscale device and conventional device applications. SAMs can modify surface properties based on their tail molecules, for example changing surfaces to become hydrophobic. ALD, on the other hand, critically depends upon surface properties. Area-selective atomic layer deposition (AS-ALD) is one feasible choice towards complex patterned semiconductor devices from a bottom-up strategy owing to the atom level-controlled processing. Self-assembled monolayers (SAM) typically could provide passivation on target surfaces to prevent further deposition with subsequent precursors, while allowing film deposition on other areas of interest.

Selective deposition can be achieved using a SAM coating as a deposition blocking layer. As a result, area-selective atomic layer deposition may facilitate the patterning of deposited layers without adding additional potentially expensive lithography or etching processes.

"Atomic layer deposition" or "cyclical deposition" as used herein refers to a process comprising the sequential exposure of two or more reactive compounds to deposit a layer of material on a substrate.

As used in this specification and the appended claims, the terms "reactive compound", "reactive gas", "reactive species", "precursor", "process gas" and the like are used interchangeably to mean a substance with a species capable of reacting with the substrate or material on the substrate in a surface reaction (e.g., chemisorption, oxidation, reduction, cycloaddition). The substrate, or portion of the substrate, is exposed sequentially to the two or more reactive compounds which are introduced into a reaction zone of a processing chamber.

Embodiments of the disclosure advantageously provide methods for treating a substrate. In one or more embodiments, the substrate comprises a first surface and a second surface. The treatment selectively blocks the first surface and allows subsequent deposition of metal or dielectric material on the second surface.

Embodiments advantageously provide methods that allow the growth of thicker AS-ALD films while avoiding a mushrooming effect by concurrently growing a passivation layer. In one or more embodiments, a two-module processing system is used to increase film selectivity on target surfaces by extending the growth of the passivation layer. In one or more embodiments, the polymer passivation layer has two modular blocks which can be modified and functionalized flexibly. Integration of these flexible modules advantageously improves compatibility with various types of ALD precursors. In one or more embodiments, this approach may be applied in high aspect ratio films, avoiding mushrooming issues with the ability to adjust the thickness of the passivation layer. Both vapor-phase SAM deposition and subsequent dielectric deposition can be done in the same ALD tool, significantly reducing processing time.

Figure 2:
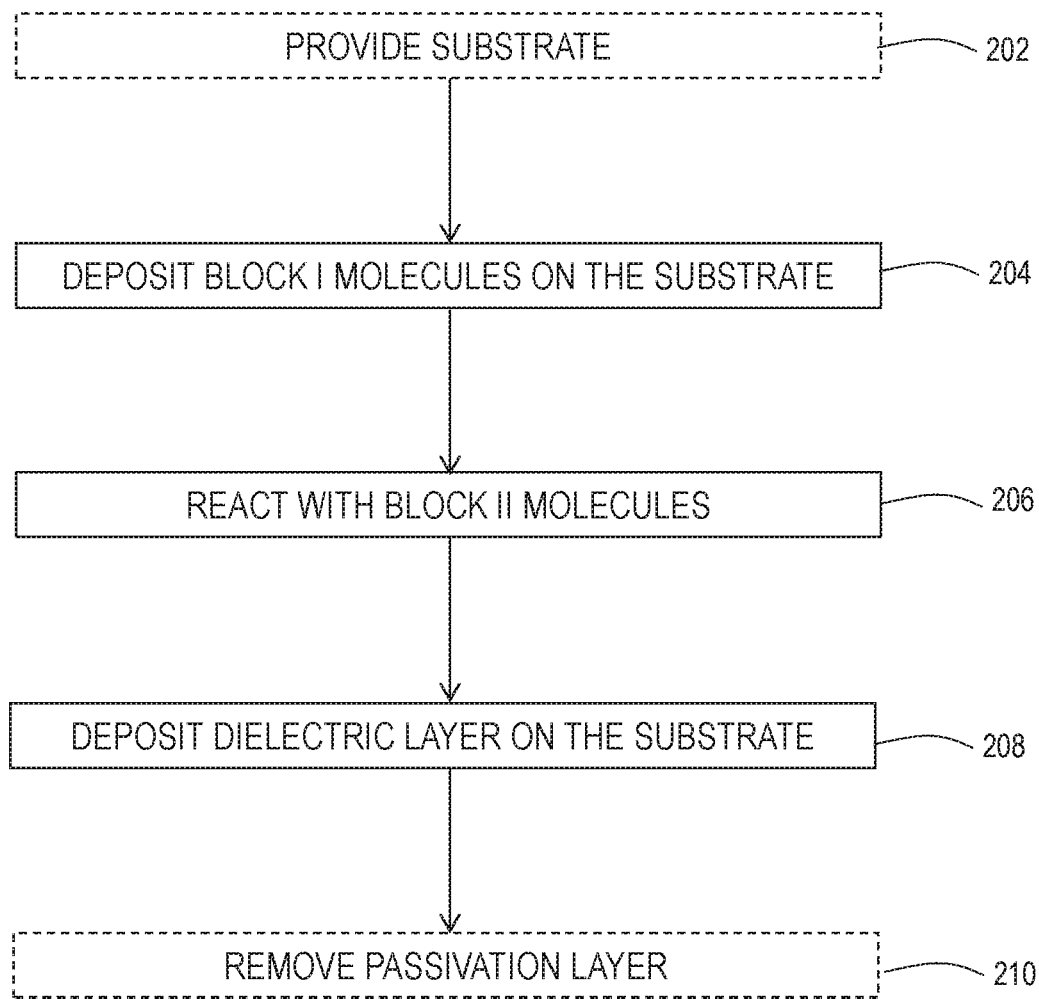
FIG. 2 illustrates a process flow diagram of a method according to one or more embodiments.

FIG. 1 illustrates a cross-sectional view of a method 100 of selectively depositing a film on a substrate surface. FIG. 2 illustrates a process flow diagram of a method 200 of selectively depositing a film according to one or more embodiments. Referring to FIGS. 1 and 2, in one or more embodiments, at operation 202, a substrate is provided. As used in this specification and the appended claims, the term "provided" means that the substrate is made available for processing (e.g., positioned in a processing chamber).

In one or more embodiments, a substrate surface includes a metal surface 102 and a dielectric surface 104. A "metal," as used herein, refers to metal, metal alloy, metal oxide, metal nitride, or combination thereof. A "metal surface", as used herein, refers to any portion of a substrate or portion of a material surface formed with the metal. The metal surface may be exposed to a pretreatment process to polish, coat, dope, etch, reduce, oxidize, hydroxylate, anneal, UV cure, e-beam cure and/or bake the substrate. In addition to the pretreatment directly on the metal surface itself, in the present disclosure, any of the metal surface treatment disclosed may also be performed on an underlayer metal surface as disclosed in more detail below, and the term "metal surface" is intended to include such underlayer as the context indicates. Thus, for example, where a film/layer or partial film/layer has been deposited onto the metal surface, the exposed surface of the newly deposited film/layer becomes the metal surface. In one or more embodiments, the metal surface 102 comprises a metal, a metal alloy, a metal oxide, a metal nitride, or a combination thereof. Non-limiting examples of metal include copper (Cu), cobalt (Co), nickel (Ni), tungsten (W), ruthenium (Ru), chromium (Cr), iron (Fe), platinum (Pt), gold (Au), silver (Ag), molybdenum (Mo), gallium (Ga), indium (In), or combinations thereof.

A "dielectric surface," as used herein, refers to any portion of a substrate or portion of a material surface formed with the dielectric material. Non-limiting examples of dielectric material include silicon oxide ($SiO_x$), silicon nitride ($Si_xN_y$), silicon (Si), silicon oxynitride (SiON), aluminum oxide ($AlO_x$), hafnium oxide ($HfO_x$), zirconium oxide ($ZrO_2$), titanium oxide ($TiO_x$), titanium nitride (TiN), tantalum oxide ($Ta_xO_5$), yttrium oxide ($Y_2O_3$), lanthanum oxide ($La_2O_3$), aluminum nitride (AlN), magnesium oxide (MgO), calcium fluoride ($CaF_2$), lithium fluoride (LiF), strontium oxide (SrO), silicon carbide (SiC), barium oxide (BaO), hafnium silicate ($HfSiO_4$), lanthanum aluminate ($LaAlO_3$), niobium pentoxide ($Nb_2O_5$), barium titanate ($BaTiO_3$), strontium titanate ($SrTiO_3$), bismuth titanate ($Bi_4Ti_3O_{12}$), Lead zirconium titanate (Pb(Zr, Ti)$O_3$), calcium copper titanate ($CaCu_3Ti_4O_{12}$), lithium niobate ($LiNbO_3$), barium titanate ($BaTiO_3$), and potassium niobate ($KNbO_3$).

In one or more embodiments, the dielectric surface 104 may be exposed to a pretreatment process to polish, coat, dope, etch, reduce, oxidize, hydroxylate, anneal, UV cure, e-beam cure and/or bake the substrate. In addition to the pretreatment directly on the dielectric surface 104 itself, in the present disclosure, any of the dielectric surface 104 treatments disclosed may also be performed on an underlayer metal surface as disclosed in more detail below, and the term "dielectric surface" is intended to include such underlayer as the context indicates. Thus, for example, where a film/layer or partial film/layer has been deposited onto the metal surface, the exposed surface of the newly deposited film/layer becomes the metal surface.

As used in this specification and the appended claims, the phrase "selectively over," or similar phrases, means that the subject material is deposited on the stated surface to a greater extent than on another surface. In some embodiments, "selectively" means that the subject material forms on the selective surface at a rate greater than or equal to about 10×, 15×, 20×, 25×, 30×, 35×, 40×, 45× or 50× the rate of formation on the non-selected surface.

At operation 204, a first type of SAM ligands, block I molecules 108, having head groups 106 bind strongly to the metal surface 102, while not binding to the dielectric surface 104. At operation 206, a second type of SAM ligands, block II molecules 112, react with the block I molecules 108 to form a thicker passivation layer 114. The block II molecules 112 advantageously have functional groups on one end that increase the thickness of the passivation layer.

Without intending to be bound by theory, it is thought that the headgroup 106 of the block I molecules 108 are selective to the metal surface 102 over the dielectric surface 104. Accordingly, the passivation layer 114 prevents a material from being deposited on the metal surface 102 during a subsequent ALD reaction. At operation 208, a dielectric layer 116 is deposited on the dielectric surface 104. At operation 210, optionally, the passivation layer 114 is removed.

In one or more embodiments, the passivation layer 114 is formed by a chemical click reaction between a Block I molecule 108 and a block II molecule 112. As used herein, the term "click reaction" refers to a way of generating products by joining small modular units. Click reactions typically occur in one pot, typically do not generate byproducts, and are characterized by a high thermodynamic driving force that drives the reaction quickly and irreversibly to high yield of a single reaction product, with high reaction specificity.

In one or more embodiments, a SAM polymer passivation layer 114 is formed with two modular blocks, Block I and Block II, using click reaction active sites. Block I module deposits on the target surface 102 first in the vapor phase, while the Block II module 112 is connected at the end of the Block I module 108 via a click reaction. In one or more embodiments, the Block I molecule 108 comprises a strong binding headgroup 106 at one end and a click reaction active site at the other end. In some embodiments, the Block I active site is selected from an alkyne group or an alkene group. In one or more embodiments, the Block II molecule 112 comprises a long carbon chains or polymers and a click reaction active site at the other end. In one or more embodiments, the Block II active site is selected from an azide group or a thiol group.

The method of one or more embodiments provides a SAM polymer passivation layer that is denser, more uniform, stable and flexibly functionalized for enhancing surface blocking of the target surface. Owing to the selective surface coating of SAMs on one target surface, the desired ALD film deposition selectively occurs on the inverse surface areas within a complex patterned structure.

In one or more embodiments, a polymer passivation layer 114 is formed by a click reaction between an alkyne and an azide. The azide-alkyne cycloaddition click reaction is a 1,3-dipolar cycloaddition between an azide and a terminal or internal alkyne to form a 1,2,3-triazole. Such a reaction is presented in Scheme I:

Scheme I

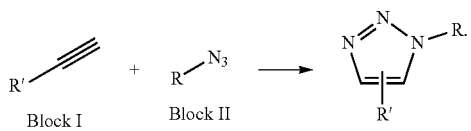

In one or more embodiments, the alkyne, a Block I molecule, comprises a headgroup, R'. In one or more embodiments, the headgroup has a strong binding affinity for a metal surface 102. In some embodiments, the headgroup is selected from the group consisting of a pyrrole group, an amine group, an acetylacetone group, an alkyl hydrazide group, a cyclic hydrazide group, a phosphonate group, a heterocyclic group, a phosphonic acid group, a phosphonic ester group, a pyrrolidine group, a pyrazole group, an imidazole group, a furan group, a biimidazole group, a thiophene group, a thiazole group, a thiadiazole group, a pyridine group, a pyridazine group, a pyrimidine group, a quinoxaline group, an indazole group, a thiazine group, a phosphinine group, a phosphinoline group, and a phosphole group. In one or more embodiments, the headgroup is attached to a hydrocarbon chain. In some embodiments, the hydrocarbon chain is n lengths long. In one or more embodiments, n is an integer from 2 to 50.

In one or more non-limiting embodiments, the alkyne comprises a compound selected from the group of Formula (I), Formula (II), Formula (III), Formula (IV), and Formula (V):

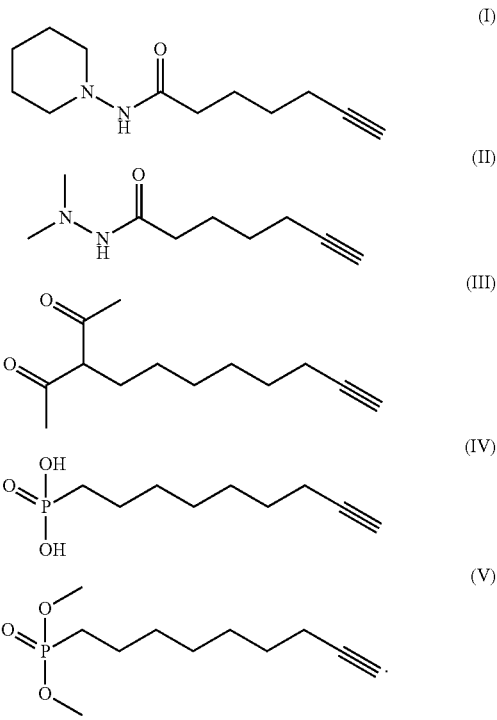

Without intending to be bound by theory, it is thought that the headgroup, R', of the alkyne can bind strongly to the metal surface 102, but cannot bind strongly to the dielectric surface 104.

In one or more embodiments, the azide, a Block II molecule, comprises a tail group, R. In some embodiments, the tail group, R, is selected from the group consisting of an alicyclic hydrocarbon chain, a branched hydrocarbon chain, a polyaryl hydrocarbon chain, and a polyester chain. In one or more embodiments, tail group, R, is attached to a hydrocarbon chain. In some embodiments, the hydrocarbon chain is m lengths long. In one or more embodiments, m is an integer from 2 to 50.

In one or more non-limiting embodiments, the azide comprises a compound selected from the group of Formula (VI), Formula (VII), Formula (VIII), Formula (IX), and Formula (X):

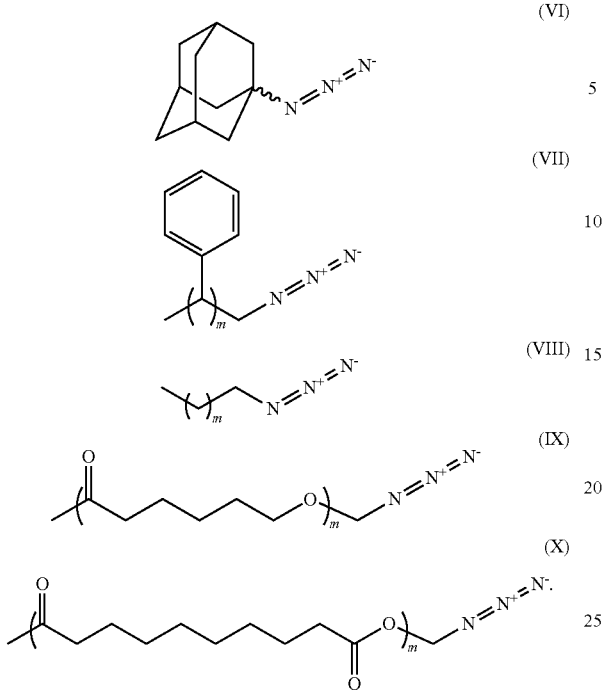

(VI)

(VII)

(VIII)

(IX)

(X)

In one or more embodiments, the passivation layer 114 is the reaction product formed by reacting an azide and an alkyne. In some embodiments, the Block I molecule 108 is deposited on the metal surface 102 via a vapor phase reaction. In other embodiments, the Block I molecule 108 is deposited by a solvent phase reaction. In one or more embodiments, the click reaction product of the Block I alkyne 108 and the Block II azide 112 forms a passivation layer 114 by thermally reacting the azide and the alkyne at a temperature in a range of from 10° C. to 150° C., or in a temperature in a range of from 30° C. to 120° C., or in a range of from 50° C. to 200° C. In some embodiments, the reaction between the Block I and the Block II molecules includes photo-initiating the reaction.

In some embodiments, the reaction of the azide and the alkyne requires the use of a catalyst. The catalyst may be any suitable catalyst known to the skilled artisan. In one or more embodiments, the catalyst is selected from the group consisting of a copper catalyst, a cobalt catalyst, a ruthenium catalyst, and a tungsten catalyst.

In one or more embodiments, the passivation layer 114 is formed by a click reaction between a thiol, a Block II molecule 112, and an alkene, a Block I molecule 108. In some embodiments, this may be known as a thiol-ene reaction. The thiol-ene reaction (also known as alkene hydrothiolation) is a reaction between a thiol and an alkene to form a thioether. Such a reaction is presented in Scheme II:

Scheme II

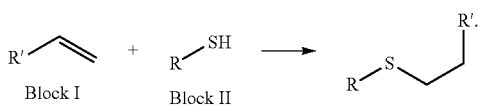

In one or more embodiments, the alkene, a Block I molecule 108, comprises a headgroup, R'. In some embodiments, the headgroup is selected from the group consisting of a pyrrole group, an amine group, an acetylacetone group, an alkyl hydrazide group, a cyclic hydrazide group, a phosphonate group, a heterocyclic group, a phosphonic acid group, a phosphonic ester group, a pyrrolidine group, a pyrazole group, an imidazole group, a furan group, a biimidazole group, a thiophene group, a thiazole group, a thiadiazole group, a pyridine group, a pyridazine group, a pyrimidine group, a quinoxaline group, an indazole group, a thiazine group, a phosphinine group, a phosphinoline group, and a phosphole group. In one or more embodiments, the headgroup is attached to a hydrocarbon chain. In some embodiments, the hydrocarbon chain is n lengths long. In one or more embodiments, n is an integer from 2 to 50.

In one or more non-limiting embodiments, the alkene comprises a compound selected from the group of Formula (XI), Formula (XII), Formula (XIII), Formula (XIV), and Formula (XV):

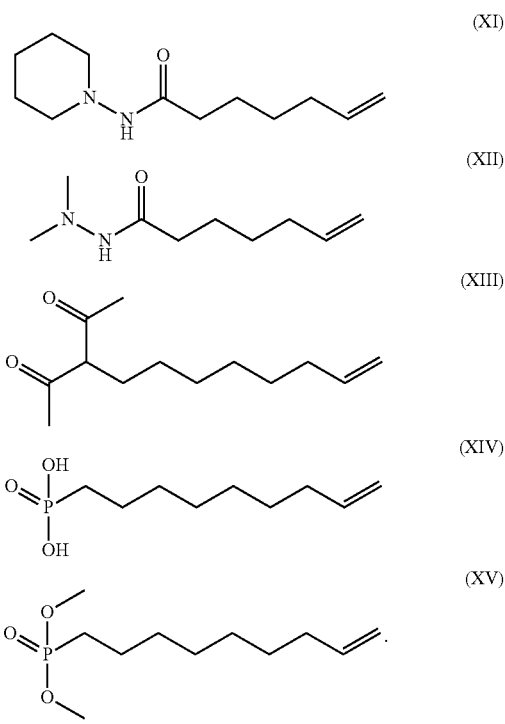

In one or more embodiments, the thiol, a Block II molecule 112, comprises a tail group, R. In some embodiments, the tail group, R, is selected from the group consisting of an alicyclic hydrocarbon chain, a branched hydrocarbon chain, a polyaryl hydrocarbon chain, and a polyester chain. In one or more embodiments, tail group, R, is attached to a hydrocarbon chain. In some embodiments, the hydrocarbon chain is m lengths long. In one or more embodiments, tail group, R, is attached to a hydrocarbon chain. In some embodiments, the hydrocarbon chain is m lengths long. In one or more embodiments, m is an integer from 2 to 50.

In one or more non-limiting embodiments, the thiol comprises a compound selected from the group of Formula (XVI), Formula (XVII), and Formula (XVIII):

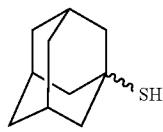 (XVI)

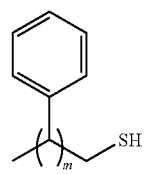 (XVII)

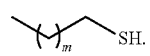 (XVIII)

In some embodiments, after forming the passivation layer 114, atomic layer deposition is used to deposit a dielectric layer 116 on the dielectric surface 104. In some embodiments, the thickness of dielectric layer 116 is equal to the thickness of passivation layer 114.

Another aspect of the disclosure provides a cyclic deposition of the passivation layer 114 and the dielectric layer 116, wherein the passivation layer 114 is cyclically grown alongside the dielectric layer 116 such that the thickness of dielectric layer 116 remains equal to, greater than, or less than the thickness of the passivation layer 114. In one or more embodiments, the cyclic deposition method reduces a sideways growth issue, also referred to a mushroom issue.

Accordingly, in the method of one or more embodiments, the passivation layer 114 is the reaction product formed by reacting a Block I molecule with a difunctional Block II molecule, followed by reaction with a difunctional Block III molecule. In some embodiments, the Block I molecule 108 is deposited on the metal surface 102 via a vapor phase reaction. In other embodiments, the Block I molecule 108 is deposited by a solvent phase reaction. The Block I molecule may be reacted with a difunctional Block II molecule. In one or more embodiments, the difunctional Block II molecule includes two azide groups. In other embodiments, the difunctional Block II molecule includes two thiol groups. In one or more embodiments, the difunctional Block II molecule is selected from one or more of Formula XIX and Formula XX

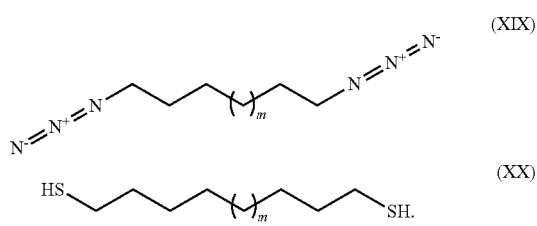

(XIX)

(XX)

Thus, in one or more embodiments, the Block I molecule reacts with one azide group of the difunctional Block II group, while the second azide group of the difunctional Block II molecule remains available for further chemical reaction. In other embodiments, the Block I molecule reacts with one thiol group of the difunctional Block II group, while the second thiol group of the difunctional Block II molecule remains available for further chemical reaction. In one or more embodiments, the unreacted group (i.e. an azide group or a thiol group) of the difunctional Block II molecule is then reacted with a difunctional Block III molecule to form the passivation layer 114. In one or more embodiments, the difunctional Block III molecule includes two alkyne groups. In other embodiments, the difunctional Block III molecule includes two alkene groups. In one or more embodiments, the difunctional Block III molecule is selected from one or more of Formula XXI and Formula XXII

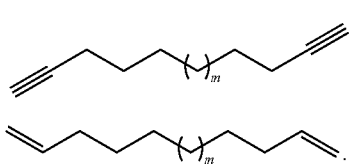

(XXI)

(XXII)

In one or more embodiments, the unreacted end of the Block II molecule reacts with one alkyne group of the difunctional Block III group, while the second alkyne group of the difunctional Block III molecule remains available for further chemical reaction. In other embodiments, the unreacted end of the Block II molecule reacts with one alkene group of the difunctional Block III group, while the second alkene group of the difunctional Block III molecule remains available for further chemical reaction. In some embodiments, the reaction may proceed by alternating difunctional Block II molecules and difunctional Block III molecules until the passivation layer 114 reaches the desired thickness.

In some embodiments, forming the passivation layer 114 followed by forming the dielectric layer 116 is repeated at least once. In some embodiments, the sequential repetition is performed in the range of 1 to 1000, 1 to 950, 1 to 900, 1 to 850, 1 to 800, 1 to 750, 1 to 700, 1 to 650, 1 to 600, 1 to 550, 1 to 500, 1 to 450, 1 to 400, 1 to 350, 1 to 300, 1 to 250, 1 to 200, 1 to 150, 1 to 100, 1 to 75, 1 to 50, 1 to 25, 200 to 1000, 300 to 1000, 400 to 1000, 500 to 1000, 600 to 1000, 700 to 1000, 800 to 1000, 900 to 1000 times. In some embodiments, the sequential repetition is performed until the final thickness of dielectric layer 116 is in the desired range. In some embodiments, the desired range includes 0.1 nm to 1000 nm, 0.1 nm to 10 nm, 100 nm to 1000 nm, 200 nm to 1000 nm, 300 nm to 1000 nm, 400 nm to 1000 nm, 500 nm to 1000 nm, 600 nm to 1000 nm, 700 nm to 1000 nm, 800 nm to 1000 nm, and 900 nm to 1000 nm.

In some embodiments, the reacting to the Block I molecule and the Block II molecule increases the thickness of the passivation layer by an amount in the range of from 1 nm to 50 nm, 1 nm to 45 nm, 1 nm to 40 nm, 1 nm to 35 nm, 1 nm to 30 nm, 1 nm to 25 nm, 5 nm to 50 nm, 5 nm to 45 nm, 5 nm to 40 nm, 5 nm to 35 nm, 5 nm to 30 nm, 5 nm to 25 nm, 10 nm to 50 nm, 10 nm to 45 nm, 10 nm to 40 nm, 10 nm to 35 nm, 10 nm to 30 nm, 10 nm to 25 nm, 15 nm to 50 nm, 15 nm to 45 nm, 15 nm to 40 nm, 15 nm to 35 nm, 15 nm to 30 nm, 15 nm to 25 nm, 20 nm to 50 nm, 20 nm to 45 nm, 20 nm to 40 nm, 20 nm to 35 nm, 20 nm to 30 nm, 20 nm to 25 nm, 25 nm to 50 nm, 25 nm to 45 nm, 25 nm to 40 nm, 25 nm to 35 nm, or 25 nm to 30 nm with each repetition.

In some embodiments, the substrate with the passivation layer is cleaned prior to performing the atomic layer deposition. In some embodiments, only the metal surface 102 with the passivation layer 102 is cleaned prior to performing the atomic layer deposition. In some embodiments, the metal surface 102 is cleaned with a hydrogen plasma. In some embodiments, the hydrogen plasma is a conductively coupled plasma (CCP). In some embodiments, the hydrogen plasma is an inductively coupled plasma (ICP). In some embodiments, the hydrogen plasma comprises plasma of $H_2$.

In some embodiments, the passivation layer 114 remains bound to the metal surface 102 at a high temperature. In one or more embodiments, the high temperature is in the range of from 50° C. to 100° C., 50° C. to 150° C., 50° C. to 200° C., 50° C. to 250° C., 50° C. to 300° C., 50° C. to 350° C., 50° C. to 400° C., 50° C. to 500° C.

In some embodiments, after the thickness of dielectric layer 116 is in the desired range, the passivation layer 114 is removed. In some embodiments, the passivation layer 114 is removed by exposing the substrate to oxygen ($O_2$) or oxygen ($O_2$) plasma. In other embodiments, the passivation layer is not removed.

In some embodiments, the passivation layer is removed from the substrate after performing the atomic layer deposition. The passivation layer may be removed by any suitable selective etching process. Suitable selective etching processes include, but are not limited to, the use of oxygen, oxygen plasmas, and fluorine plasmas. In some embodiments, when oxygen or oxygen plasma is used to remove the passivation layer, a metal oxide layer is formed on the metal surface. In some embodiments, the metal oxide layer formed on the metal surface is removed through the use of a reduction process. Suitable reduction processes include, but are not limited to, the use of plasmas comprising hydrogen or ammonia and thermal anneals comprising hydrogen or ammonia. In some embodiments, the oxygen plasma, fluorine plasma, hydrogen plasma and ammonia plasma can be independently remotely or internally generated, and conductively coupled or inductively coupled. In some embodiments, the passivation layer is removed by sequential exposure of the substrate to an oxygen plasma and a hydrogen plasma.

In some embodiments, the reaction zone is in a modular system comprising multiple chambers which perform various functions including substrate center-finding and orientation, degassing, annealing, deposition and/or etching. According to one or more embodiments, the modular system includes at least a first processing chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known modular systems which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in the processing chamber of modular system, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, the inert gas is used to purge or remove some or all of the reactants (e.g., reactant). According to one or more embodiments, the inert gas is injected at the exit of the processing chamber to prevent reactants (e.g., reactant) from moving from the processing chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the reactive gases. During substrate movement, different portions of the substrate surface, or material on the substrate surface, are exposed to the two or more reactive gases so that any given point on the substrate is substantially not exposed to more than one reactive gas simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In another aspect of the spatial ALD process, the reactive gases are delivered simultaneously to the reaction zone but are separated by an inert gas curtain and/or a vacuum curtain. The gas curtain can be combination of inert gas flows into the processing chamber and vacuum stream flows out of the processing chamber. The substrate is moved relative to the gas delivery apparatus so that any given point on the substrate is exposed to only one reactive gas.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

In a time-domain ALD process in some embodiments, exposure to each reactive gas, which includes but not limited to the metal and dielectric material to be used for the ALD film, is separated by a time delay to allow each compound to adhere and/or react on the substrate surface and then be purged from the processing chamber. The reactive gases are prevented from mixing by the purging of the processing chamber between subsequent exposures.

In another aspect of a time-domain ALD process of some embodiments, a time delay exists between pulses of reactive gases. During each time delay, a purge gas, such as argon, is introduced into the processing chamber to purge the reaction zone or otherwise remove any residual reactive gas or reaction products or by-products from the reaction zone. Alternatively, the purge gas may flow continuously throughout the deposition process so that only the purge gas flows during the time delay between pulses of reactive gases. The reactive gases are alternatively pulsed with a pulse of purge gas there between multiple times. The purge may also be achieved with a vacuum pump with or without an inert gas.

The durations for each pulse/dose are variable and may be adjusted to accommodate, for example, the volume capacity of the processing chamber as well as the capabilities of a vacuum system coupled thereto. Additionally, the dose time of a reactive gas may vary according to the flow rate of the reactive gas, the temperature of the process gas, the type of control valve, the type of process chamber employed, as well as the ability of the components of the process gas to adsorb onto the substrate. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Once the passivation layer is deposited, the method may optionally include further processing (e.g., bulk deposition of a dielectric film). In some embodiments, the further processing may be an ALD process.

The disclosure provides that the processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor or controller, transforms the general purpose computer into a specific purpose computer (controller) that controls the chamber operation such that the processes are performed. The process can be stored on non-transitory computer readable medium including instructions, that, when executed by a controller of a substrate processing chamber, causes the substrate processing chamber to perform the operations of: deposit a block I molecule on the metal surface, the block I molecule comprising one or more of an alkyne and an alkene; and react the block I molecule with a block II molecule to form a passivation layer on the metal surface, the block II molecule comprising one or more of an azide and a thiol.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of selectively depositing a film on a substrate surface including a metal surface and a dielectric surface, the method comprising:
   depositing a block I molecule on the metal surface, the block I molecule comprising one or more of an alkyne and an alkene; and
   reacting the block I molecule with a block II molecule using a catalyst to form a passivation layer on the metal surface, the block II molecule comprising one or more of an azide and a thiol.

2. The method of claim 1, wherein the alkyne and the alkene independently comprise a headgroup selected from the group consisting of a pyrrole group, an amine group, an acetylacetone group, an alkyl hydrazide group, a cyclic hydrazide group, a phosphonate group, a heterocyclic group, a phosphonic acid group, a phosphonic ester group, a pyrrolidine group, a pyrazole group, an imidazole group, a furan group, a biimidazole group, a thiophene group, a thiazole group, a thiadiazole group, a pyridine group, a pyridazine group, a pyrimidine group, a quinoxaline group, an indazole group, a thiazine group, a phosphinine group, a phosphinoline group, and a phosphole group, the headgroup attached to a hydrocarbon chain n lengths long.

3. The method of claim 2, wherein the azide and the thiol independently comprise a tail group selected from the group consisting of an alicyclic hydrocarbon chain, a branched hydrocarbon chain, a polyaryl hydrocarbon chain, and a polyester chain, the tail group attached to a hydrocarbon chain m lengths long, wherein m is an integer.

4. The method of claim 3, wherein m is an integer from 2 to 50.

5. The method of claim 2, wherein n is an integer from 2 to 50.

6. The method of claim 1, wherein depositing the film includes a vapor phase or solvent phase reaction.

7. The method of claim 1, wherein depositing the film includes a vapor phase reaction.

8. The method of claim 1, wherein the block I molecule and the block II molecule are thermally reacted at a temperature in a range of from 10° C. to 200° C.

9. The method of claim 1, wherein the block II molecule is selected from one or more of

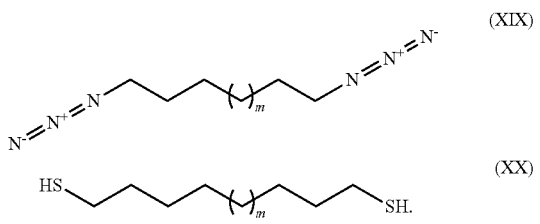

10. The method of claim 9, further comprising reacting with a difunctional Block III molecule selected from one or more of

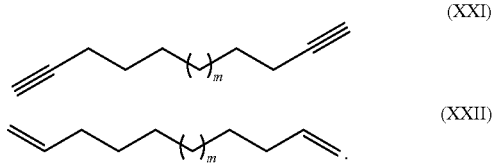

11. The method of claim 1, wherein reacting comprises photo-initiating a reaction between the block I molecule and the block II molecule.

12. The method of claim 1, wherein the catalyst is selected from the group consisting of a copper catalyst, a cobalt catalyst, a ruthenium catalyst, and a tungsten catalyst.

13. The method of claim 1, wherein the method is performed in a substrate processing chamber.

14. The method of claim 1, further comprising depositing a dielectric film on the dielectric surface.

15. A method of selectively depositing a film on a substrate surface including a metal surface and a dielectric surface, the method comprising:
forming a passivation layer on the metal surface by reacting one or more of an alkyne and an alkene with one or more of a thiol and an azide, the alkyne and the alkene independently comprising a headgroup selected from the group consisting of a pyrrole group, an amine group, an acetylacetone group, an alkyl hydrazide group, a cyclic hydrazide group, a phosphonate group, a heterocyclic group, a phosphonic acid group, a phosphonic ester group, a pyrrolidine group, a pyrazole group, an imidazole group, a furan group, a biimidazole group, a thiophene group, a thiazole group, a thiadiazole group, a pyridine group, a pyridazine group, a pyrimidine group, a quinoxaline group, an indazole group, a thiazine group, a phosphinine group, a phosphinoline group, and a phosphole group, the headgroup attached to a hydrocarbon chain n lengths long, the azide and the thiol independently comprising a tail group selected from the group consisting of an alicyclic hydrocarbon chain, a branched hydrocarbon chain, a polyaryl hydrocarbon chain, and a polyester chain, the tail group attached to hydrocarbon chain m lengths long; and
depositing a dielectric layer on the dielectric surface.

16. The method of claim 15, wherein forming the passivation layer comprises a thermal reaction at a temperature in a range of from 10° C. to 200° C.

17. The method of claim 15, wherein forming the passivation layer comprises photo-initiating a reaction between one or more of an alkyne and an alkene with one or more of a thiol and an azide.

18. The method of claim 15, wherein reacting the azide and the alkyne comprises using a catalyst, the catalyst is selected from the group consisting of a copper, a cobalt, a ruthenium, and a tungsten catalyst.

19. A non-transitory computer readable medium including instructions, that, when executed by a controller of a processing chamber, cause the processing chamber to perform operations of:
deposit a block I molecule on a metal surface, the block I molecule comprising one or more of an alkyne and an alkene; and
using a catalyst to react the block I molecule with a block II molecule to form a passivation layer on the metal surface, the block II molecule comprising one or more of an azide and a thiol.

20. A method of selectively depositing a film on a substrate surface including a metal surface and a dielectric surface, the method comprising:
depositing a block I molecule on the metal surface, the block I molecule comprising one or more of an alkyne and an alkene; and
reacting the block I molecule with a block II molecule to form a passivation layer on the metal surface, the block II molecule comprising one or more of an azide and a thiol, wherein the block I molecule and the block II molecule are thermally reacted at a temperature in a range of from 10° C. to 200° C.

21. A method of selectively depositing a film on a substrate surface including a metal surface and a dielectric surface, the method comprising:
depositing a block I molecule on the metal surface, the block I molecule comprising one or more of an alkyne and an alkene; and
reacting the block I molecule with a block II molecule to form a passivation layer on the metal surface, the block II molecule comprising one or more of an azide and a thiol, wherein the azide and the thiol independently comprise a tail group selected from the group consisting of an alicyclic hydrocarbon chain, a branched hydrocarbon chain, a polyaryl hydrocarbon chain, and a polyester chain, the tail group attached to a hydrocarbon chain m lengths long, wherein m is an integer.

* * * * *